(12) United States Patent
Krames et al.

(10) Patent No.: US 6,849,472 B2
(45) Date of Patent: Feb. 1, 2005

(54) NITRIDE SEMICONDUCTOR DEVICE WITH REDUCED POLARIZATION FIELDS

(75) Inventors: Michael R. Krames, Mountain View, CA (US); Tetsuya Takeuchi, Sunnyvale, CA (US); Norihide Yamada, Tokyo (JP); Hiroshi Amano, Nagoya (JP); Isamu Akasaki, Nagoya (JP)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/992,192

(22) Filed: Nov. 13, 2001

(65) Prior Publication Data

US 2002/0084467 A1 Jul. 4, 2002

Related U.S. Application Data

(60) Continuation-in-part of application No. 09/717,647, filed on Nov. 21, 2000, now Pat. No. 6,569,704, which is a division of application No. 09/162,708, filed on Sep. 29, 1998, now Pat. No. 6,229,151.

(30) Foreign Application Priority Data

Sep. 30, 1997 (JP) .............................................. 9-265311

(51) Int. Cl.[7] ............................................. H01L 21/00
(52) U.S. Cl. ............................. 438/22; 438/46; 438/47; 438/48; 438/604
(58) Field of Search ............................ 438/22, 46, 47, 438/48, 479, 33, 39, 42, 604, 606, 930, 931

(56) References Cited

U.S. PATENT DOCUMENTS

| | | | | |
|---|---|---|---|---|
| 4,952,792 A | * | 8/1990 | Caridi .......................... | 257/18 |
| 5,081,519 A | * | 1/1992 | Nishimura .................. | 257/200 |
| 5,561,301 A | * | 10/1996 | Inoue .......................... | 257/13 |
| 5,602,418 A | * | 2/1997 | Imai et al. .................. | 257/627 |
| 5,625,202 A | * | 4/1997 | Chai ............................ | 257/94 |
| 5,727,008 A | * | 3/1998 | Koga .......................... | 372/43 |
| 5,742,628 A | * | 4/1998 | Fujii ............................ | 372/45 |
| 5,880,485 A | * | 3/1999 | Marx et al. .................. | 257/94 |
| 6,229,151 B1 | | 5/2001 | Takeuchi et al. .............. | 257/14 |

FOREIGN PATENT DOCUMENTS

| | | |
|---|---|---|
| EP | 0 716 457 A2 | 12/1995 |
| EP | 0 743 727 A1 | 5/1996 |
| WO | 96/24167 | 2/1996 |
| WO | 01/41224 A2 | 11/2000 |
| WO | WO 02/03474 A2 | 1/2002 |

OTHER PUBLICATIONS

Sun et al. "Piezoelectric Fields in Strained (In, Ga) As/GaAs Multiple–Quantum well Structures Grown on Vicinal (110) GaAs", Feb. 1994, IEEE, vol. 30, pp. 466–470.*

(List continued on next page.)

*Primary Examiner*—Maria Guerrero
(74) *Attorney, Agent, or Firm*—Patent Law Group LLP

(57) ABSTRACT

A method for fabricating a light-emitting semiconductor device including a III-Nitride quantum well layer includes selecting a facet orientation of the quantum well layer to control a field strength of a piezoelectric field and/or a field strength of a spontaneous electric field in the quantum well layer, and growing the quantum well layer with the selected facet orientation. The facet orientation may be selected to reduce the magnitude of a piezoelectric field and/or the magnitude of a spontaneous electric field, for example. The facet orientation may also be selected to control or reduce the magnitude of the combined piezoelectric and spontaneous electric field strength.

20 Claims, 8 Drawing Sheets

OTHER PUBLICATIONS

H. Amano, N. et al., "Metalorganic vapor phase epitaxial growth of a high quality GaN film using an AlN buffer layer", Appl. Phys. Lett. 48 (5), Feb. 3, 1986, pp. 353–355.

Shuji Nakamura, "GaN Growth Using GaN Buffer Layer", Japanese Journal of Applied Physics vol. 30, No. 10A, Oct. 1991, pp. L1705–L1707.

Noriyuki Kuwano et al., "Cross–sectional TEM study of microstructures in MOVPE GaN films grown on $\alpha$–$Al_2O_3$ with a buffer layer of AlN", Journal of Crystal Growth 115 (1191), pp. 381–387.

Dongjin Byun et al., "Optimization of the GaN–buffer growth on 6H–SiC(0001)", Thin Solid Films 289 (1996), pp. 256–260.

K. Horina et al., "Initial Growth Stage of AlGaN Grown Directly On (0001) 6H–SiC By MOVPE", Mat. Res. Soc. Symp. Proc. vol. 449 1997 Materials Research Society, pp. 73–78.

Tetsuya Takeuchi et al., "Quantum–Confined Stark Effect due to Piezoelectric Fields in GaInN Strained Quantum Wells", Jpn. J. Appl. Phys. vol. 36 (1997), pp. L382–L385, Part 2. No. 4A, Apr. 1, 1997.

Tetsuya Takeuchi et al., "Theoretical Study of Orientation Dependence of Piezoelectric Effects in Wurtzite Strained GaInN/GaN Heterstructures and Quantum Wells", Jpn. J. Appl. Phys. vol. 39 (2000) pp. 413–416, Part 1, No. 2A, Feb. 2000.

K. Horino et al. "Growth of (1100) Oriented GaN on (1100) 6H–SiC by Metalorganic Vapor Phase Epitaxy", International Symposium on Blue Laser and Light Emitting Diodes, Chiba Univ., Japan, Mar. 5–7, 1996, pp. 530–533.

K. Domen, "Analysis of polarization anisotropy along the c axis in the photoluminescence of wirtzite GaN" Appl. Phys. Lett. 71 (14), Oct. 6, 1997, 3 pp.

Seoung–Hwan Park et al., "Crystal–orientation effects on the peizoelectric field and electronic properties of strained wurtzite semiconductors", Physical Review B, vol. 59, No. 7, Feb. 15, 1991–I, pp. 4725–4737.

Andreas Hanglieter, "The role of piezoelectric fields in GaN–based quantum wells", MRS Internet J. Nitride Semicond. Res. 3, 15 (1998) 1998–1999 The Materials Research Society, pp. 1–8.

Fabio Bernardini et al., "Spontaneous polarization and piezoelectric constants of III–V nitrides", 1997 The American Physical Society, vol. 56, No. 16, Oct. 15, 1997–II, pp. R10 024–R10 027.

Tetsuya Takeuchi et al., "Determination of piezoelectric fields in strained GaInN quantum wells using the quantum–confined Stark effect", Applied Physics Letters, vol. 73, No. 12, Sep. 21, 1996, pp 1691–1693.

S.F. Chichibu et al., "Optical properties of InGaN quantum wells", Materials Science and Engineering B59 (1999), pp. 298–306.

S.F. Chichibu et al., "Effective band gap inhomogeneity and piezoelectric field in InGaN/GaN multiquantum well structures", Applied Physics Letters, vol. 73, No. 14, Oct. 5, 1998, pp. 2006–2008.

Takashi Mukai, et al., "Current and Temperature Dependences of Electoluminescence of InGaN–Based UV/Blue/Green Light–Emitting Diodes", Jpn. J. Appl. Phys. vol. 37 (1998), pp. L1358–L1361.

Fabio Della Sala, et al., "Free–carrier screening of polarization fields in wurtzite GaN/InGaN laser structures", Applied Physics Letters, vol. 74, No. 14, Apr. 5, 1999, pp. 2002–2004.

L.H. Peng, et al., "Piezoelectric effects in the optical properties of strained InGaN quantum wells", Applied Physics Letters, vol. 74, No. 6, Feb. 8, 1999, pp. 795–797.

W.W. Chow, "Quantum–well width dependence of threshold current density in InGaN lasers", Applied Physics Letters, vol. 75, No. 2, Jul. 12, 1999, pp. 244–246.

Edited by Shuji Nakamura and Shigefusa F. Chichibu, "Introduction to Nitride Semiconductor Blue Lasers and Light Emitting Diodes", First published 2000 by Taylor & Francis, 8 pp.

Atsuko Niwa et al., "Valence subband structures of (1010)–GaN/AlGaN strained quantum wells calculated by the tight–binding method", Appl. Phys. Lett. 70 (16), Apr. 21, 1997, pp. 2159–2161.

Akihiko Ishibashi et al., "Metalorganic Vapor Phase Epitaxy Growth of a High–Quality GaN/InGaN Single Quantum Well Structure Using a Misoriented SiC Substrate", Jpn. J. Appl. Phys. vol. 36 (1997), pp. 1961–1965.

D.A.B. Miller, D.S. Chemla et al., "Band–Edge Electoabsorption in Quantum Well Structures: The Quantum–Confined Stark Effect" Physical Review Letters, vol. 53, No. 22, Nov. 26, 1984, pp. 2173–2176.

K. Domen et al., "Optical gain for wurtzite GaN with anisotropic strain in c plane", Appl. Phys. Lett 70 (8), Feb. 24, 1997, pp. 987–989.

D.L. Smith et al., "Piezoelectric effects in strained–layer superlattices", J. Appl. Phys. 63 (8), Apr. 15, 1998, pp. 2717–2719.

* cited by examiner

NITRIDE SEMICONDUCTOR DEVICE WITH REDUCED POLARIZATION FIELDS

CROSS REFERENCE TO RELATED APPLICATIONS

This is a continuation in part of U.S. patent application Ser. No. 09/717,647 filed on Nov. 21, 2000, now U.S. Pat. No. 6,569,704, which is a divisional of U.S. patent application Ser. No. 09/162,708 filed Sep. 29, 1998, now U.S. Pat. No. 6,229,151. U.S. patent application Ser. No. 09/717,647 and U.S. Pat. No. 6,229,151 are incorporated herein by reference in their entirety.

FIELD OF THE INVENTION

The present invention relates to optical semiconductor devices, and particularly, to a structure for improving the efficiency of light emitters and photodetectors fabricated from GaN-based semiconductors.

BACKGROUND

In the following discussion a III-N semiconductor is a semiconductor having a Group III element and nitrogen. III-N semiconductors such as GaN are useful in fabricating light emitting elements that emit in the blue and violet regions of the optical spectrum. These elements include light emitting diodes and laser diodes. Laser diodes that use semiconductor material based on GaN that emit in the blue and violet regions of the spectrum hold the promise of substantially improving the amount of information that can be stored on an optical disk. However, higher efficiencies are needed for both semiconductor light emitters and photodetectors. This is a particularly urgent problem in GaN-based optical semiconductor devices using BN, AlN, GaN, or InN, which are compounds of nitrogen and Group III elements such as B, Al, Ga, and In and their mixed crystal semiconductors (hereinafter, called GaN-based semiconductors).

Light emitting elements based on III-N semiconductors are typically fabricated by creating a p-n diode structure having a light generating region between the p-type and n-type layers. The diode is constructed from layers of III-N semiconducting materials. After the appropriate layers are grown, electrodes are formed on the p-type and n-type layers to provide the electrical connections for driving the light-emitting element.

One class of blue and green light-emitting diodes (LEDs) or short-wavelength laser diodes (LDs) use GaInN/GaN strained quantum wells or GaInN/GaInN strained quantum wells located between the n-type and p-type layers to generate light by the recombination of electrons and holes injected from these layers. In prior art devices, a strained GaN-based semiconductor layer is constructed by growing a {0001} plane of a GaN-based crystal. The resulting layer has a large piezoelectric field. For example, in a $Ga_{0.9}In_{0.1}N$ strained layer, an extremely large piezoelectric field of around 1 MV/cm is generated.

In addition, III-Nitride semiconductors having a wurtzite crystal structure exhibit a spontaneous polarization. This spontaneous polarization results in sheets of fixed charge at interfaces between III-Nitride layers of different alloy compositions, such as at the interfaces between a III-Nitride quantum well layer and adjacent III-Nitride layers. These charge sheets produce an electric field in the quantum well layer. This electric field, which may also be extremely large, will be referred to herein as a spontaneous electric field.

Usually, when an electric field exists in a quantum well, the energy band of the quantum well layer tends to tilt substantially as the electric field increases. As a result, the wave functions of the electrons and holes separate from one another, and the overlap integrals of both wave functions decrease. Since the optical properties such as the light emission and absorption efficiencies depend on these overlap integrals, the efficiency of these devices decreases with increasing electric fields.

What is needed is a III-Nitride light emitting device in which the problems associated with the internal piezoelectric and spontaneous electric fields have been overcome.

SUMMARY

A method for fabricating a light-emitting semiconductor device including a III-Nitride quantum well layer includes selecting a facet orientation of the quantum well layer to control a field strength of a piezoelectric field and/or a field strength of a spontaneous electric field in the quantum well layer, and growing the quantum well layer with the selected facet orientation. The facet orientation may be selected to reduce the magnitude of a piezoelectric field and/or the magnitude of a spontaneous electric field, for example. The facet orientation may also be selected to control or reduce the magnitude of a combined field strength of a piezoelectric field and a spontaneous electric field in the quantum well layer.

In one embodiment, the quantum well layer is grown with a wurtzite crystal structure with the selected facet orientation tilted at least 1°, preferably at least 10°, from the {0001} direction of the wurtzite crystal structure. For example, the selected facet orientation may be advantageously tilted at about 30° to about 50°, about 80° to about 100°, or about 130° to about 150° from {0001}. In another embodiment, the quantum well layer is grown with a zincblende crystal structure with the selected facet orientation tilted at least 1°, preferably at least 10°, from the {111} direction of the zincblende crystal structure.

In some embodiments the quantum well layer is grown above a nucleation layer grown directly on a substrate surface. The nucleation layer may be grown, for example, by metal-organic vapor deposition at a temperature such that the crystal structure of the nucleation layer substantially replicates the crystal structure of the substrate surface. The substrate surface may be selected to have a lattice mismatch of less than about 10% with the material from which the quantum well layer is formed.

In one embodiment, a resulting light-emitting semiconductor device includes a III-Nitride quantum well layer having a wurtzite crystal structure and a facet orientation tilted from the {0001} direction of the wurtzite crystal structure at an angle of about 30° to about 50° or about 130° to about 150°. In one implementation, the quantum well layer is formed over a nucleation layer grown directly on a surface of, for example, a SiC, AlN, or GaN substrate. The crystal structure of this nucleation layer substantially replicates the crystal structure of the substrate surface.

As a result of the reduced magnitude of piezoelectric, spontaneous, or combined piezoelectric and spontaneous electric field strengths in their quantum well layers, light-emitting devices in accordance with the present invention may generate light with increased efficiency compared to prior art devices.

DETAILED DESCRIPTION

The present invention is based in part on the observation that the piezoelectric field in a strained quantum well layer depends on the orientation of the crystal structure of the quantum well layer, and hence, by controlling the facet orientation, the piezoelectric field can be minimized. The manner in which this is accomplished may be more easily understood with reference to two types of strained quantum well structures, those based on a wurtzite crystal structure and those based on a zincblende crystal structure.

Figure 1:
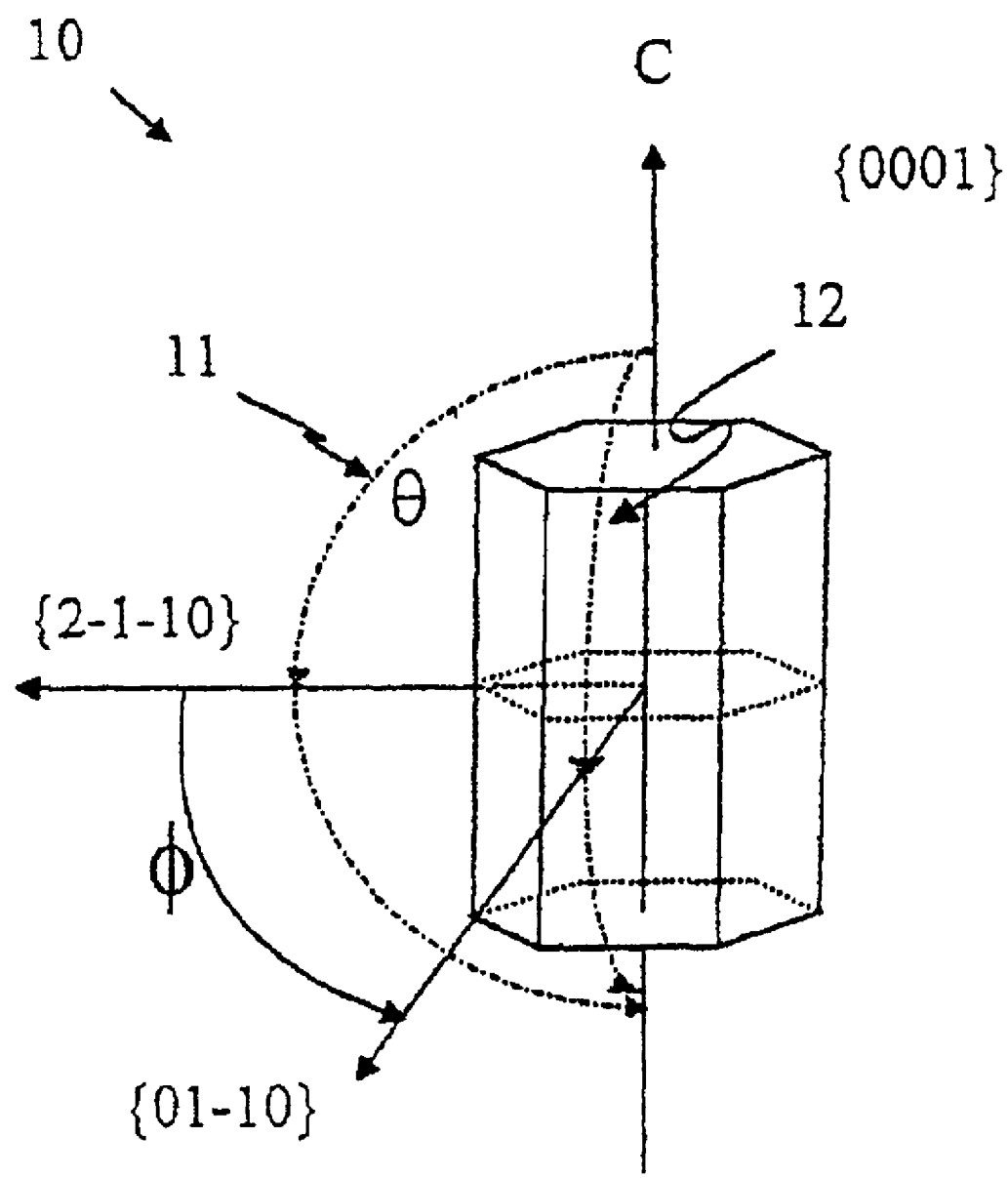
FIG. 1 illustrates the crystal structure of a WZ—GaN-based semiconductor.
Figure 2:
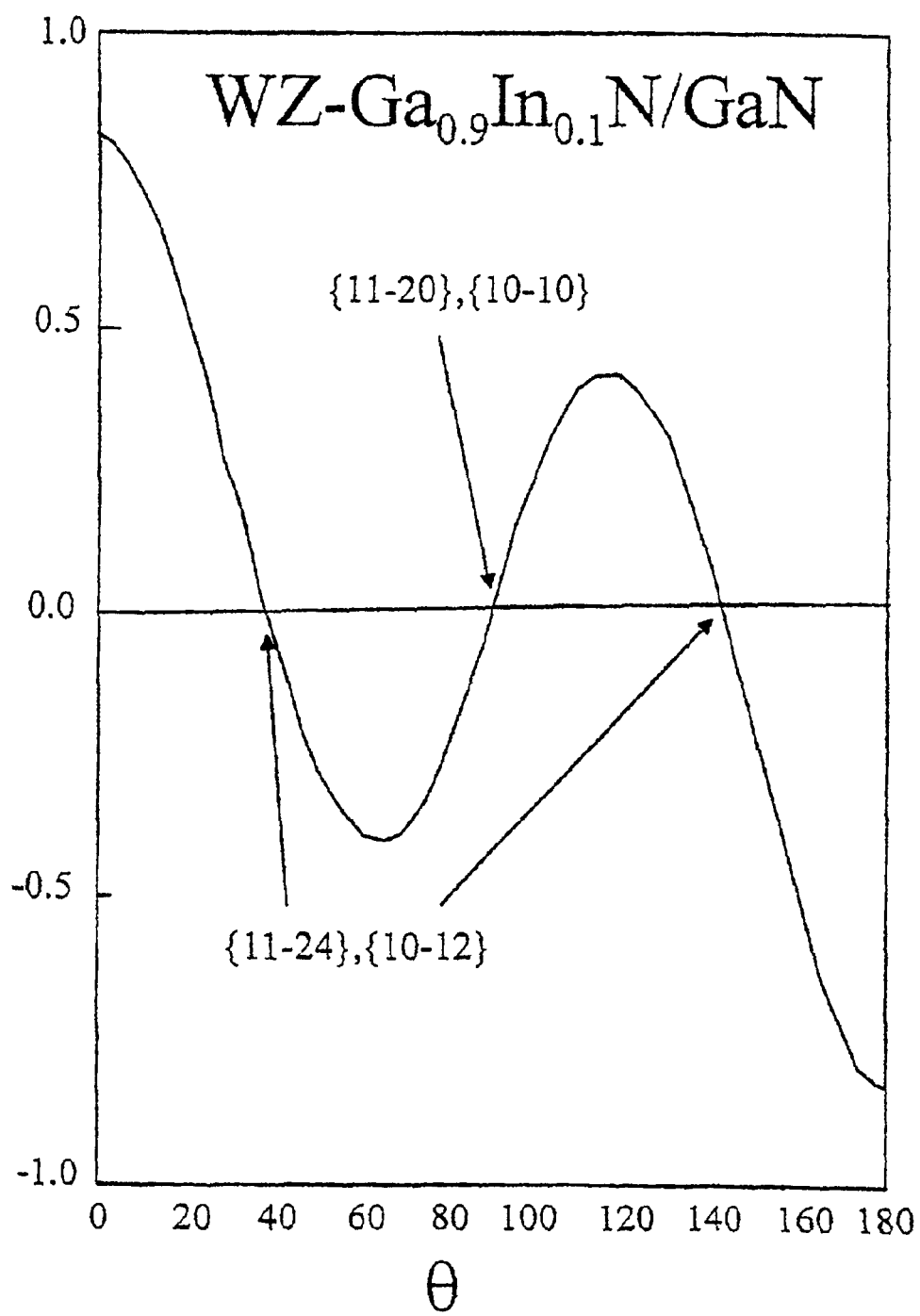
FIG. 2 is a graph of the piezoelectric field generated in the quantum well with respect to the growth orientation of the WZ—GaN-based semiconductor quantum well.

Refer now to FIG. 1 which illustrates a wurtzite crystal GaN (WZ—GaN) structure 10. The piezoelectric field generated in a crystal having a facet orientation along arc 11 in FIG. 1 is shown in FIG. 2 as a function of the angle $\theta$ between the {0001} direction and the facet orientation. The data shown in FIG. 2 is for $Ga_{0.9}In_{0.1}N$ strained quantum well layers. The piezoelectric field reaches maxima in the {0001} direction or the {000-1} direction, and has three orientations at which the piezoelectric field is zero. The same result is obtained for other arcs, e.g., arc 12. That is, the piezoelectric field is uniquely determined by the difference in the angle between the {0001} direction and the facet orientation of the concerned plane, i.e., the piezoelectric field is independent of $\phi$.

Hence it is clear from FIG. 2 that there are three sets of planes for which there is no piezoelectric field. For example, the planes at 90° to the c-axis such as, for example, the a-plane, {2-1-10}, the m-plane {0-110}, etc. The planes around 40° and 140° to the c-axis also provide planes with a zero piezoelectric field, e.g., the planes {2-1-14}, {01-12}, etc.

The strength of the piezoelectric field depends on the strain in and the composition of the InGaN strained quantum well layer. However, the 90° facet orientation measured from the {0001} direction where the piezoelectric field becomes 0 does not strongly depend on the ratio of Ga to In. In addition, for typical InGaN quantum well LEDs the plane orientations corresponding to the 40° and 140° orientations discussed above typically change by no more than about of 5° from the 40° and 140° values determined for the composition shown in FIG. 2.

The present invention is also based in part on the observation that the strength of the spontaneous electric field in a wurtzite crystal structure III-Nitride quantum well layer depends on the facet orientation of the quantum well layer, and hence the spontaneous electric field can also be minimized by controlling the facet orientation. For example, the spontaneous electric field approaches zero for a III-Nitride quantum well layer having approximately an a-plane or approximately an m-plane facet orientation. Such facet orientations are tilted at angles of, for example, about 80° to about 90° with respect to the {0001} direction of the wurtzite crystal structure.

The strength of the spontaneous electric field also depends on the composition of the quantum well layer and on the composition of its adjacent layers. For the case of $Ga_{0.9}In_{0.1}N$ quantum well layers between GaN layers (as considered in FIG. 2, for example), the piezoelectric field is typically much larger than the spontaneous electric field. Hence, in this case the combination of the piezoelectric and spontaneous electric fields is dominated by the piezoelectric field, and it may be advantageous to select a facet orientation that minimizes the piezoelectric field. For quantum well layers or adjacent layers formed from other III-Nitride compositions, such as materials including aluminum, for example, the spontaneous electric field may be comparable to or even dominate the piezoelectric field. If the spontaneous electric field dominates the piezoelectric field, it may be advantageous to select a facet orientation that minimizes the spontaneous electric field. If the piezoelectric and spontaneous electric fields are comparable, it may be advantageous to select a facet orientation that minimizes the combined field but does not necessarily minimize either the spontaneous or piezoelectric fields separately.

Figure 3:
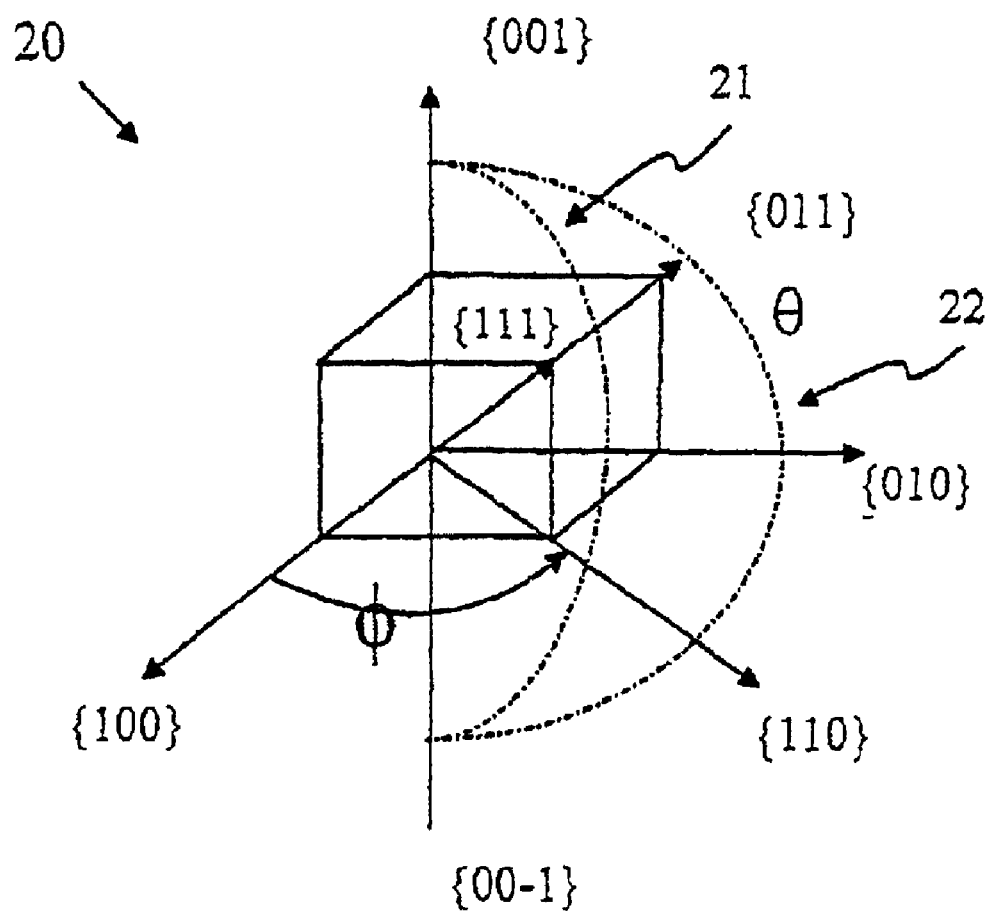
FIG. 3 illustrates the crystal structure of a ZB—GaN-based semiconductor.

A similar analysis can be applied to other crystal structures. Consider a zincblende crystal structure GaN-based semiconductor layer, referred to as ZB—GaN in the following discussion. A ZB—$Ga_{0.9}In_{0.1}N$ strained quantum well layer can be formed on GaN in a manner analogous to the WZ—GaN-based semiconductor strained quantum well layer discussed above. FIG. 3 shows the crystal structure 20 of the ZB—GaN-based semiconductor. To simplify the discussion, the spherical coordinate system used with reference to FIG. 1 will also be used here. The radius vector has a polar angle $\theta$ measured from the {001} direction and a cone angle, $\Phi$ about the {001} direction. First and second paths having a constant azimuth angle are shown at 21 and 22.

Figure 4:
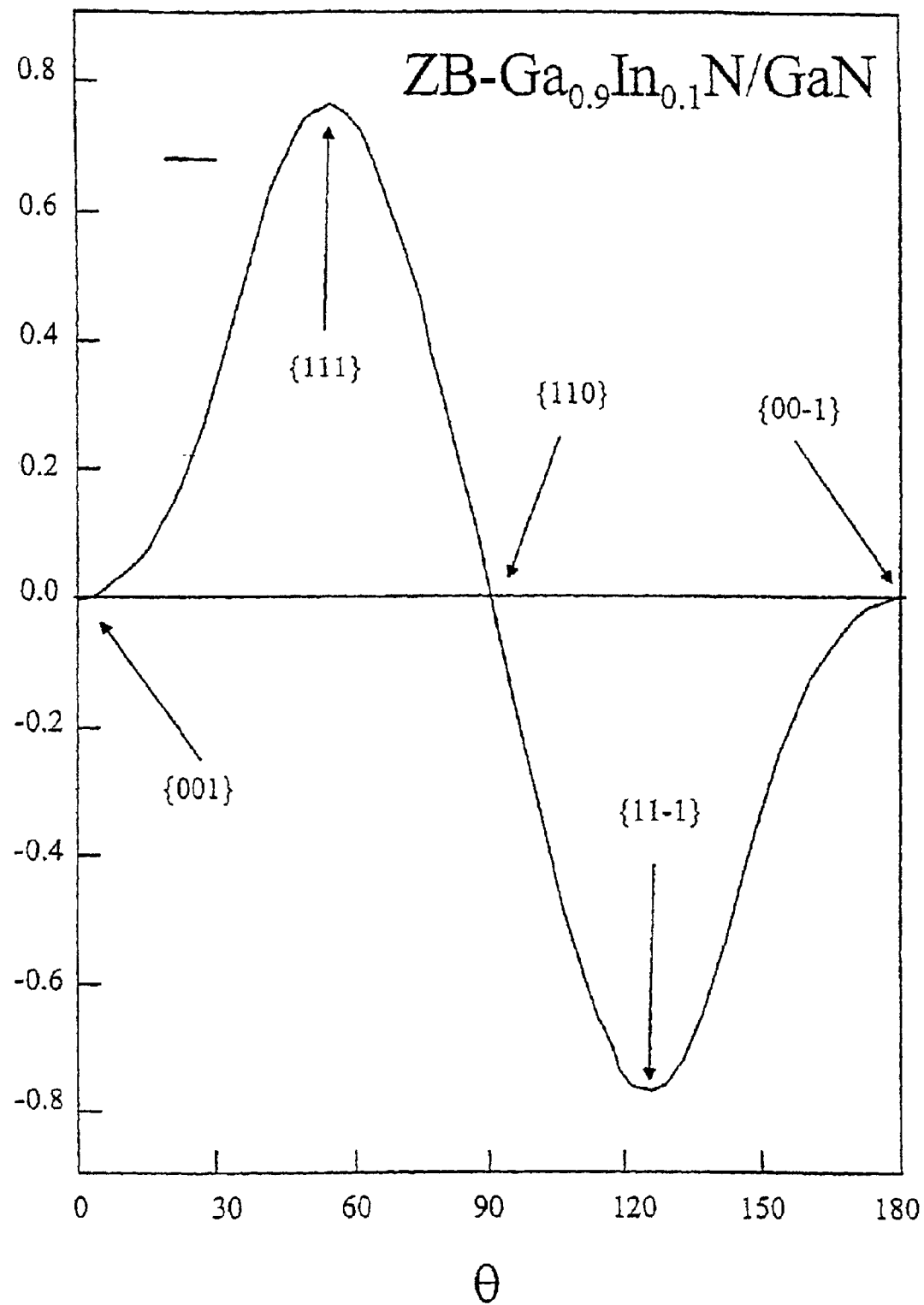
FIG. 4 is a graph of the piezoelectric field strength generated in the quantum well with respect to the first path shown in FIG. 3.

Refer now to FIG. 4, which is a plot of the piezoelectric field in the strained quantum well layer with respect to the polar angle $\theta$ for various orientations of the strained quantum well layer on path 21. In FIG. 4, $\Phi=45°$ and the {001} direction corresponds to $\theta=0°$. The {111} direction corresponds to $\theta=54.7°$, the {110} direction corresponds to $\theta=90°$, and the {11-1} direction corresponds to $\theta=125.3°$. It is clear from FIG. 4, that the piezoelectric field has maxima in the {111} direction ($\theta$ around 55°) and the {11-1} direction ($\theta$ around 125°). More importantly, the piezoelectric field goes to zero for $\theta=0$, 90°, and 180°.

A similar analysis with respect to path 22 shows that the piezoelectric field is essentially 0 for all points along this path. Path 22 corresponds to a $Ga_{0.9}In_{0.1}N$ strained quantum well layer in which the growth orientation corresponds to $\theta$ and $\Phi=90°$. Hence, in a strained quantum well crystal of ZB—GaN-based semiconductor, almost no piezoelectric field is generated in the strained quantum well layer that has growth planes beginning in the {001} plane or {011} plane and a facet orientation angle $\theta$ on path 22. A similar result holds for planes that are equivalent to these.

The manner in which the above-described observations are used in the fabrication of a light emitter will now be explained with the aid of FIG. 5 which is a cross-sectional view of a light-emitting device 30 according to the present invention. Light-emitting device 30 may be, e.g., a light-emitting diode or a laser diode. If the crystal growth orientation is excluded, the composition of each deposited layer is essentially that used in a conventional III-Nitride light-emitting device.

Light-emitting device 30 is constructed from a number of layers. An n-type GaN contact layer 33, an n-type AlGaN cladding layer 34, a strained multiple quantum well layer 35, a p-type AlGaN cladding layer 36, and a p-type GaN contact layer 37 are successively deposited on a substrate 31 which is typically, AlN, SiC, or GaN. An n-electrode 38 and a p-electrode 39 are deposited as shown.

The strained multiple quantum well layer 35 is typically constructed from GaInN/GaN or GaInN/GaInN. In a light-emitting device according to the present invention, the layers of the quantum well may be caused to grow such that the piezoelectric field, the spontaneous electric field, or the combination of the piezoelectric field and the spontaneous electric field in the quantum well layer is negligible.

As noted above, there are a number of planes for which the piezoelectric field is substantially zero. One of these may be utilized in a light-emitting device according to the present invention. The particular plane will depend on the type of crystal. For example, in the case of a WZ—GaN light emitter, the {2-1-10} plane of the strained quantum layer material can be caused to grow by selecting the appropriate growing surface of substrate 31. If the substrate is SiC, for example, the SiC may be cut such that the {2-1-10} plane is used for growing layer 33. The choice of an a-plane (e.g., {2-1-10}) or an m-plane facet orientation also minimizes the spontaneous electric field and thus the combination of the piezoelectric and spontaneous electric fields.

Figure 5:
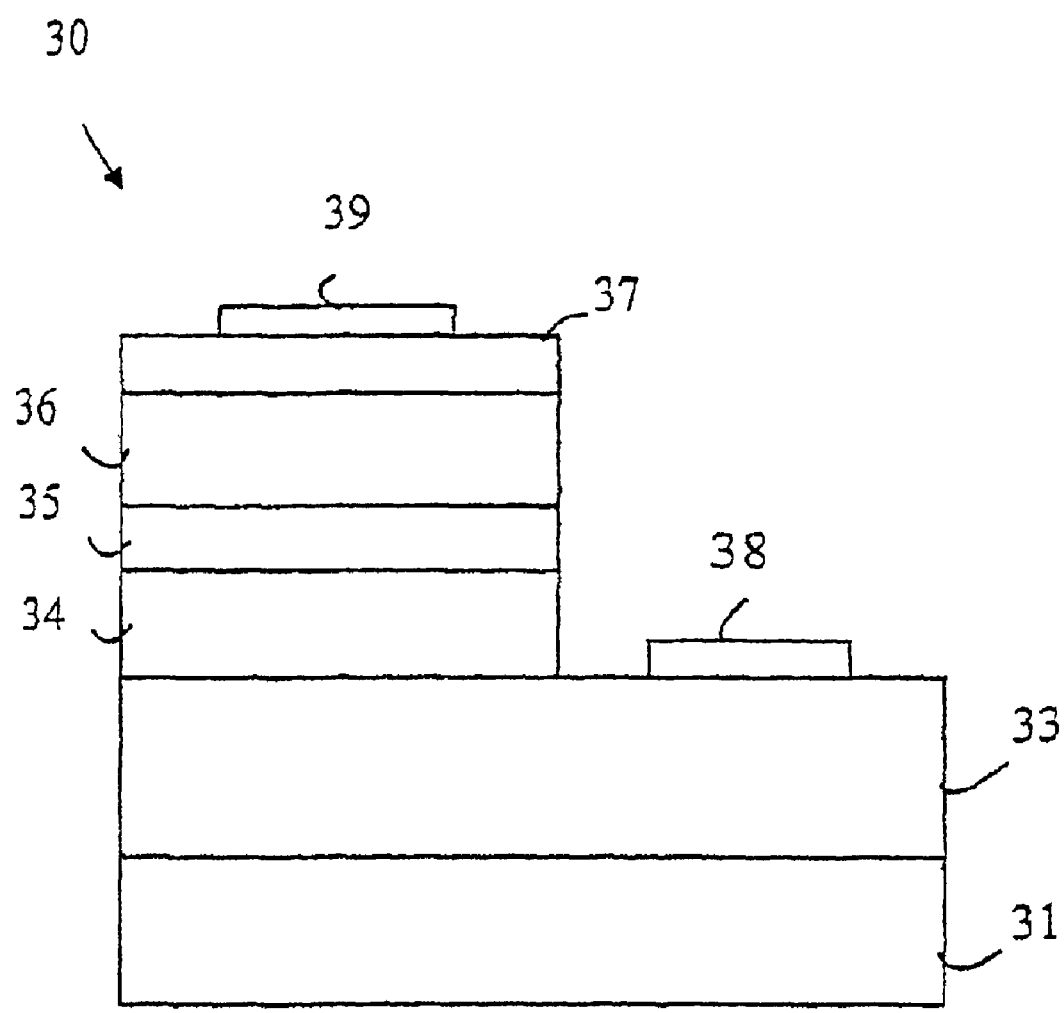
FIG. 5 is a cross-sectional view of a light-emitting device according to one embodiment of the present invention.
Figure 6:
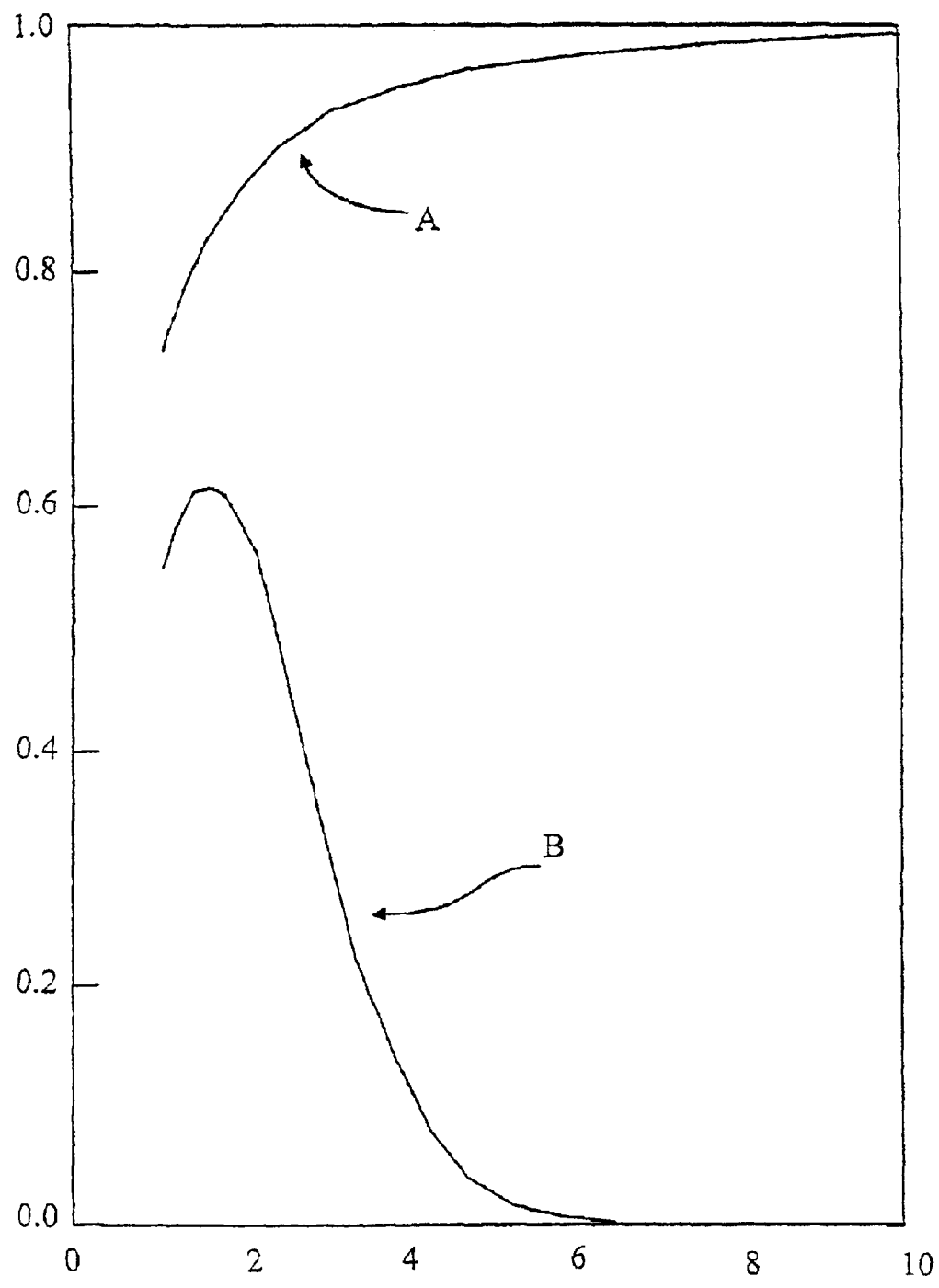
FIG. 6 is a graph of the relative light generation efficiency of quantum wells in a semiconductor device of the present invention and a prior art semiconductor device as functions of the well width.

The relative efficiency of a light-emitting device according to the present invention (in which the combination of the piezoelectric and spontaneous electric fields is negligible) and a conventional light-emitting device including a quantum well having a {0001} facet orientation (such as a conventional device grown on the {0001} plane of a sapphire substrate, for example) is shown in FIG. 6 as a function of the width of the quantum well. Curve A is the efficiency for the device discussed above with reference to FIG. 5, and curve B is the efficiency of the conventional device. It will be appreciated from this figure that the present invention provides a substantial improvement in the efficiency of light generation.

Conventional III-Nitride light-emitting devices frequently include a III-Nitride nucleation layer grown on the substrate by metal-organic chemical vapor deposition at a low temperature (typically less than about 800° C.) to accommodate lattice mismatch between the substrate and device layers grown above the nucleation layer. This is typically the case for devices grown on sapphire substrates, for example. Unfortunately, low temperature III-Nitride nucleation layers and III-Nitride device layers grown above them typically adopt a wurtzite crystal structure with a {0001} facet orientation regardless of the facet orientation of the substrate surface on which the layers are grown. As noted above, this leads to a high piezoelectric field and poor efficiency.

Figure 8:
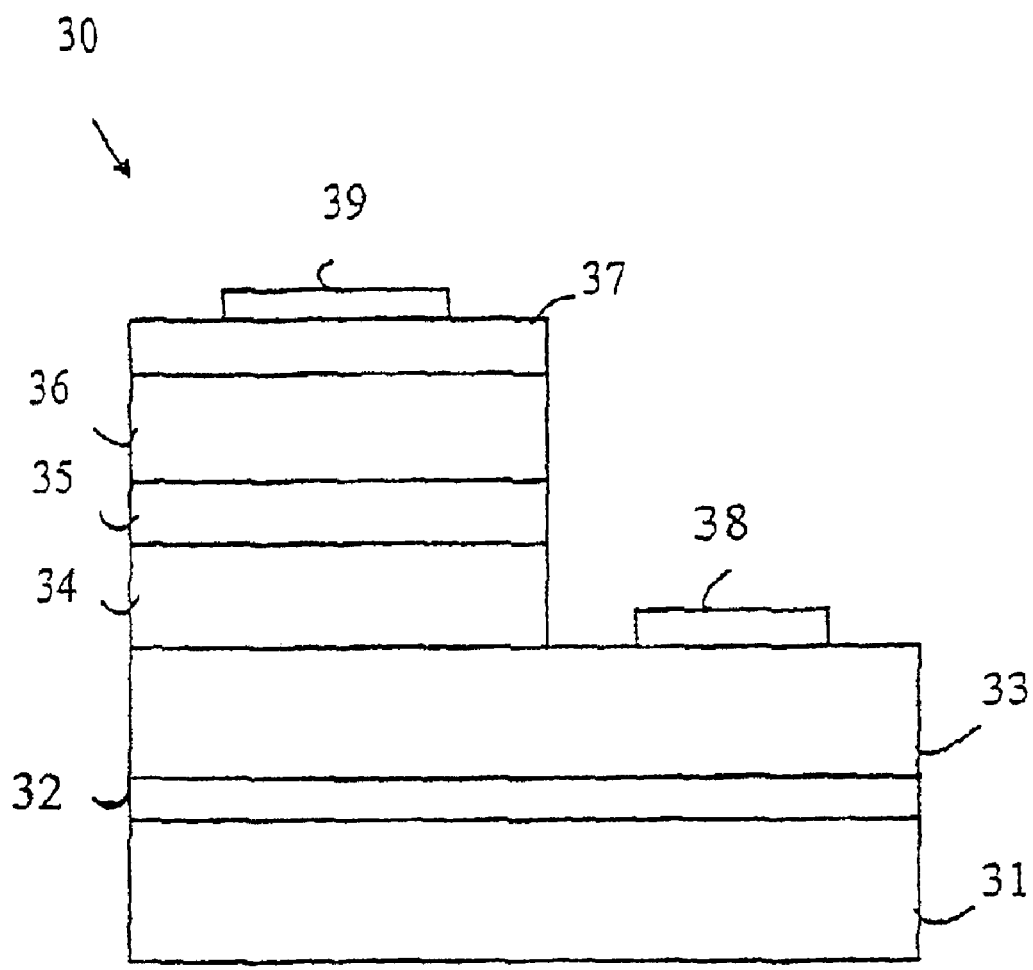
FIG. 8 is a cross-sectional view of a light-emitting device according to a third embodiment of the present invention.

Referring to FIG. 8, in one embodiment of the present invention light-emitting device 30 includes a high temperature III-Nitride nucleation layer 32 in addition to the layers shown in FIG. 5. High temperature III-Nitride nucleation layer 32 is grown directly on substrate 31 by, e.g., metal-organic chemical vapor deposition at a temperature sufficiently high that the crystal structure of layer 32 substantially replicates that of the surface of substrate 31 on which layer 32 is grown. In particular, the facet orientation of high temperature nucleation layer 32 and of subsequently grown layers is substantially the same as that of the surface of substrate 31. Consequently, the facet orientation of quantum wells in multiple quantum well layer 35 can be controlled by selecting the facet orientation of the surface of substrate 31 on which high temperature III-Nitride nucleation layer 32 is grown.

Nucleation layer 32 is typically grown at a temperature greater than about 800° C. The composition of nucleation layer 32 may include, for example, nitrogen and any element or combination of elements from group III of the periodic table. Typically, the composition of nucleation layer 32 is selected to have a lattice mismatch of less than about 10% with the surface of substrate 31 on which layer 32 is grown and with subsequently grown device layers.

In this embodiment, substrate 31 is typically a non-{0001} orientation substrate chosen to have a lattice mismatch of less than about 10% with nucleation layer 32. Suitable substrates in this embodiment include but are not limited to non-{0001} planes of SiC, AlN, and GaN as described above.

Although FIG. 8 shows n-type GaN contact layer 33 grown directly on high temperature nucleation layer 32, other implementations may include additional layers disposed between nucleation layer 32 and contact layer 33. Such additional layers may include, for example, buffer layers and defect reduction layers.

In one implementation, substrate 31 is a SiC substrate having a growth surface with a facet orientation at an angle of about 40° from {0001}, and high temperature nucleation layer 32 is an $Al_xGa_{1-x}N$ layer with $0<x\leq 1$. In this implementation, nucleation layer 32 is typically grown at a temperature of about 1000° C. to about 1200° C., more typically about 1100° C. The mole fraction x of Aluminum in nucleation layer 32 is typically about 0.04 to about 1.0. The thickness of nucleation layer 32 in this implementation is typically about 100 Angstroms (Å) to about 1 micron ($\mu$m).

It may be particularly advantageous to grow III-Nitride light-emitting devices on SiC substrates having growth surfaces with facet orientations at about 40° or about 140° from {0001}. The crystal structures of these facets are more like the {0001} facet than are the a-planes and m-planes. Consequently, it may be easier to grow high quality III-Nitride crystals on SiC substrate facets oriented at about 40° or about 140° from {0001} than on SiC a-plane or m-plane facets. Moreover, it is difficult and wasteful of material to prepare a-plane or m-plane SiC substrates from standard commercially available SiC ingots. It may be more cost-effective to prepare SiC substrates with facet orientations of about 40° or about 140° from {0001}.

In another implementation of the embodiment illustrated in FIG. 8, substrate 31 is an AlN substrate having a growth surface with a facet orientation at an angle of about 90° from {0001}. The growth surface may be an a-plane or an m-plane, for example. In this implementation also, nucleation layer 32 may be formed from $Al_xGa_{1-x}N$ ($0<x\leq 1$) typically grown at a temperature of about 1000° C. to about 1200° C., more typically about 1100° C. The mole fraction x of Aluminum in nucleation layer 32 and the thickness of layer 32 may be as described in the above implementation, for example.

The present invention may also be utilized to provide improved performance from photodetectors. Photodetectors fabricated by growing the device on the {0001} plane of a sapphire substrate exhibit an efficiency and absorption band that depend on light intensity. In particular, the efficiency of conversion increases with light intensity while the useful wavelength range decreases.

In a photodetector according to the present invention, the device is grown on a substrate that results in, for example, little or no piezoelectric field in the strained quantum well layer. Hence, the dependence of the efficiency and the absorption band on light intensity are substantially reduced or eliminated. In general, the growing technique for a photodetector is the same as that used to construct a light emitter, however, thicker strained quantum well layers are utilized to improve the absorption of the incident light.

Figure 7:
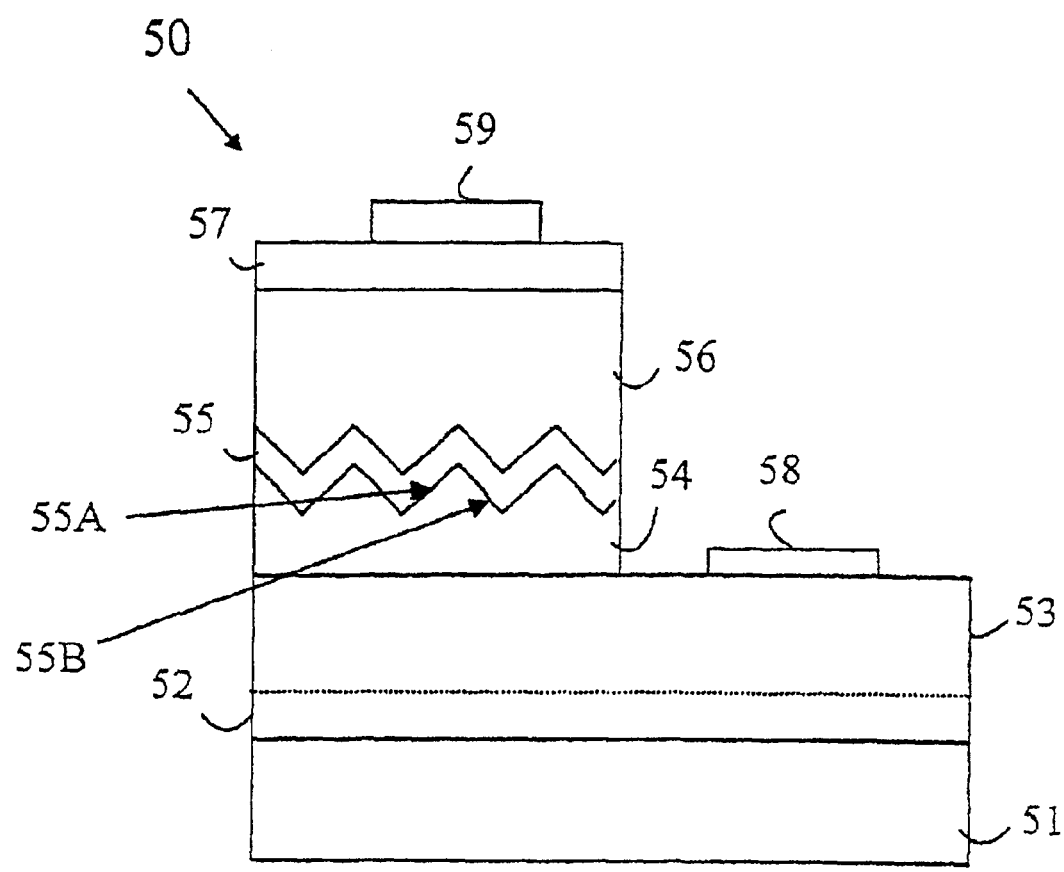
FIG. 7 is a cross-sectional view of a light-emitting device according to a second embodiment of the present invention.

It would be advantageous in many circumstances to utilize a sapphire or SiC substrate in which the layers, except for strained quantum wells, are grown on the {0001} plane, since substrates cut to provide growth on a {0001} plane are commercially available. Refer now to FIG. 7 which is a cross-sectional view of the optical semiconductor device 50 according to another embodiment of the present invention in which only the layers related solely to light emission and absorption have the desired facet orientation. Device 50 is constructed by growing an n-type GaN contact layer 53 and an n-type AlGaN cladding layer 54 on the {0001} plane orientation on the substrate 51 such as SiC or GaN based on conventional technology. Next, by selective growing or selective etching, the {2-1-14} plane or {01-12} plane, for example, is formed. The GaInN/GaN or GaInN/GaInN strained multiple quantum well layer 55 is then formed by repeating the crystal growth.

Next, the remaining p-type Al GaN cladding layer 56 and the p-type GaN contact layer 57 are successively deposited and formed. The p-type Al GaN cladding layer 56 and the p-type GaN contact layer 57 change the crystal structure back to that corresponding to the {0001} plane from the facet orientation of the well layer 55 and become layers with specific thicknesses. The n-electrode 58 and the p-electrode 59 are formed as the electrodes on the n-type GaN contact layer 53 and the p-type GaN contact layer 57, respectively. The growing surfaces 55A, 55B on both sides of the GaInN strained multiple quantum well layer 55 are, for example, the {01-12} plane or the {2-1-14} plane. The p-type AlGaN cladding layer 56 and the p-type GaN contact layer 57 become flat growing surfaces. To simplify the next process, it is advisable that they be several microns thick. In the preferred embodiment of the present invention, an AlN buffer layer 52 is grown on the substrate 51.

As noted above, the specific plane selected for growing the quantum well layer depends on the crystal type. For devices based on compound semiconductors other than GaN, such as AlN, it can be shown, for example, that the piezoelectric field as a function of the facet orientation behaves similarly to that described above if the crystal type is the same. The orientation inclination, θ, for which the piezoelectric field is 0 may, however, change by as much as 10°.

Various modifications to the present invention will become apparent to those skilled in the art from the foregoing description and accompanying drawings. Accordingly, the present invention is to be limited solely by the scope of the following claims.

We claim:

1. A method for fabricating a light-emitting semiconductor device including a III-Nitride light emitting layer, said method comprising:

selecting a facet orientation of said III-Nitride light emitting layer to control a field strength of a piezoelectric field therein; and growing said III-Nitride light emitting layer with a wurtzite crystal structure with said selected facet orientation, said selected facet orientation being tilted at least 10° from the {0001} direction of said wurtzite crystal structure.

2. The method of claim 1, further comprising selecting said facet orientation to reduce a magnitude of an electric field strength in said light emitting layer.

3. The method of claim 1, further comprising growing said light emitting layer with a wurtzite crystal structure with said selected facet orientation tilted from the {0001} direction of said wurtzite crystal structure at an angle selected from about 30° to about 50°, about 80° to about 100°, and about 130° to about 150°.

4. The method of claim 1, further comprising growing a nucleation layer directly on a substrate surface, and growing said light emitting layer above said nucleation layer.

5. The method of claim 4, further comprising selecting said substrate surface to have a lattice mismatch of less than about 10% with a material from which said nucleation layer is formed.

6. The method of claim 4, further comprising growing said nucleation layer by metal-organic chemical vapor deposition at a temperature such that a crystal structure of said nucleation layer substantially replicates a crystal structure of said substrate surface.

7. The method of claim 4, further comprising selecting a material from which said substrate is formed from the group consisting of SiC, AlN, and GaN.

8. The method of claim 4, wherein said nucleation layer comprises a III-Nitride material.

9. The method of claim 1, further comprising:

growing a first semiconductor layer above a substrate, said first semiconductor layer being grown with a first facet orientation different from said selected facet orientation;

altering an exposed surface of said first semiconductor layer to provide a surface having said selected facet orientation; and growing said light emitting layer above said surface having said selected facet orientation.

10. The method of claim 9, wherein altering said exposed surface comprises selectively etching said first semiconductor layer.

11. The method of claim 9, further comprising growing a second semiconductor layer above said light emitting layer, said second semiconductor layer being grown with a facet orientation about equal to said first facet orientation.

12. The method of claim 1 wherein said selected facet orientation is tilted about 90° from the {0001} direction of said wurtzite crystal structure.

13. The method of claim 1 wherein said selected facet orientation is the a-plane.

14. The method of claim 1 wherein said selected facet orientation is the m-plane.

15. The method of claim 1 wherein said light emitting layer is a quantum well layer.

16. A method for fabricating a light-emitting semiconductor device including a III-Nitride light emitting layer, said method comprising:

selecting a facet orientation of said III-Nitride light emitting layer to control a field strength of a piezoelectric field therein; and growing said III-Nitride light emitting layer with a zincblende crystal structure with said selected facet orientation, said selected facet orientation being tilted at least 1° from the {111} direction of said zincblende crystal structure.

17. A method for fabricating a light-emitting semiconductor device including a III-Nitride light emitting layer, said method comprising:

selecting a facet orientation of said III-Nitride light emitting layer to control a field strength of a spontaneous electric field therein; and growing said III-Nitride light emitting layer with a wurtzite crystal structure with said selected facet orientation, said selected facet orientation being tilted at least 10° from the {0001} direction of said wurtzite crystal structure.

18. The method of claim 17, further comprising selecting said facet orientation to reduce a magnitude of an electric field strength in said light emitting layer.

19. A method for fabricating a light-emitting semiconductor device including a III-Nitride light emitting layer, said method comprising:

selecting a facet orientation of said III-Nitride light emitting layer to reduce a magnitude of a combined field strength of a piezoelectric field and a spontaneous electric field therein; and growing said III-Nitride light emitting layer with a wurtzite crystal structure with said selected facet orientation, said selected facet orientation being tilted at least 10° from the {0001} direction of said wurtzite crystal structure.

20. The method of claim 19 further comprising growing said light emitting layer with a wurtzite crystal structure with said selected facet orientation tilted from the {0001} direction of said wurtzite crystal structure at an angle selected from about 80° to about 100°.

* * * * *